United States Patent [19]

Erickson

[11] Patent Number: 4,642,581

[45] Date of Patent: Feb. 10, 1987

[54] ULTRASONIC TRANSDUCER DRIVE CIRCUIT

[75] Inventor: John J. Erickson, Kingston, N.Y.

[73] Assignee: Sono-Tek Corporation, Poughkeepsie, N.Y.

[21] Appl. No.: 747,349

[22] Filed: Jun. 21, 1985

[51] Int. Cl.⁴ .............................................. H03B 5/30

[52] U.S. Cl. ................................ 331/154; 239/102.2; 331/25

[58] Field of Search ......................... 331/25, 154, 158; 310/316, 318, 319; 318/116; 366/116; 239/4, 102

[56] References Cited

U.S. PATENT DOCUMENTS

| | | | |
|---|---|---|---|
| 2,917,691 | 12/1959 | DePrisco et al. | 318/118 |
| 3,121,534 | 2/1964 | Wilson | 239/102 |
| 3,400,892 | 9/1968 | Ensminger | 239/102 |
| 3,889,166 | 6/1975 | Scurlock | 318/116 |
| 3,975,650 | 8/1976 | Payne | 310/8.1 |
| 4,044,297 | 8/1977 | Nobue et al. | 239/102 X |
| 4,056,761 | 11/1977 | Jacoby et al. | 318/116 |
| 4,275,363 | 6/1981 | Mishiro et al. | 310/316 X |
| 4,277,758 | 7/1981 | Mishiro | 331/1 R |
| 4,302,728 | 11/1981 | Nakamura | 310/316 X |
| 4,336,509 | 6/1982 | Bernitz | 239/102 X |
| 4,445,063 | 4/1984 | Smith | 310/316 |
| 4,562,413 | 12/1985 | Mishiro et al. | 310/316 X |

*Primary Examiner*—Eugene R. Laroche
*Assistant Examiner*—David Mis
*Attorney, Agent, or Firm*—Kenyon & Kenyon

[57] ABSTRACT

A drive circuit for an ultrasonic atomizer comprising a switching mode power driver circuit and an oscillator circuit to drive the power driver circuit with a signal proportional to the phase response of the atomizer's transducer element so as to fix the frequency of the power delivered to the atomizer at the frequency of the transducer. The oscillator circuit has an oscillator which generates and supplies said drive signal, an integrated circuit phase-locked loop in a feedback loop arrangement to detect the transducer's phase response and signal the oscillator to shift its drive signal frequency to the transducer's frequency and a second order low pass filter to control the rate of the oscillator frequency shift.

11 Claims, 7 Drawing Figures

ULTRASONIC TRANSDUCER DRIVE CIRCUIT

TECHNICAL FIELD

This invention relates generally to a drive circuit for an ultrasonic transducer and, more particularly, relates to a drive circuit for an ultrasonic atomizer.

BACKGROUND OF THE INVENTION

An ultrasonic atomizer typically comprises an elongated metallic body having interposed piezoelectric (PZT) elements therein and a liquid feed tube extending axially through the body from a rear liquid inlet to a front tip element. Electrical excitation of the PZT elements (i.e., the transducer) generates mechanical compression waves along the axis of the atomizer structure. When the PZT elements are electrically driven at the self-resonant frequency of the structure (point of maximum admittance and zero phase), a maximum motion at the tip element is produced. If a suitable fluid is introduced to the tip element, via the liquid feed tube, and an adequate electrical drive is present to produce a maximum tip motion, the fluid will atomize (i.e., break into small particles and dislodge from the tip element). This atomizing process depends upon (1) a controlled flow of liquid, (2) sufficient electrical drive power, and (3) proper drive frequency to the transducer.

However, the effect of introducing fluid to the tip element of the atomizer contributes a significant, dynamic load impedance to the voltage and current drive requirements. The load impedance changes the self-resonant frequency of the atomizer and shifts the frequency of the transducer to a new operating point. For maximum power transfer, it is essential that the drive power to the transducer has a frequency which always corresponds to that of the atomizer/transducer self-resonant frequency. In addition, the resistive component of the load impedance requires that additional drive power at the new frequency be provided to the transducer in order to maintain operation of the atomizer. Therefore, the transducer drive circuit must adapt to the changing conditions imposed by the atomizing process as follows: (1) adjust the drive frequency to compensate for load change due to the dynamics of the atomizing fluid, and (2) adjust the drive power to maintain fluid atomization with minimum applied power.

The major design problems of known drive systems are associated with the derivation of techniques for providing appropriate adaptive frequency and power control. A standard drive circuit for automatically controlling the drive frequency includes a phase comparator which senses the phase difference between the voltage and current of the drive signal. by insuring that the drive voltage and current are in phase, the circuit enables the excitation frequency to always follow the new self-resonant frequency of the atomizer due to the load impedance of the fluid. An example of this type of drive circuit can be found in U.S. Pat. No. 2,917,691. However, such circuits are often complex, expensive and inefficient.

SUMMARY OF THE INVENTION

The foregoing problems are obviated by the present invention which is an ultrasonic transducer drive circuit comprising: (a) variable power driving means for supplying power to and driving the transducer; (b) oscillating means for generating and supplying a drive signal, with a frequency proportional to the phase response of the transducer, to the power driving means, said drive signal fixing the frequency of the power supplied substantially at the frequency of the transducer; (c) means for detecting the phase response of the transducer and inputting a signal proportional thereto to the oscillating means such that the frequency of the oscillating means is shifted proportional to the phase response of the transducer; and (d) low pass filter means, coupled between the oscillating means and the means for locking, for controlling the rate of the frequency shift of the oscillating means.

The drive circuit can be arranged as a positive feedback system where the oscillating means, the means for detecting and the low pass filter means combination is a feedback driver for the driving means, said combination being responsive to a voltage outputted by the driving means and proportional to the phase of the current in the transducer.

In order to make a range of power available for fluid atomization, the power driving means can be a switching mode power driver circuit, such as, a transformer/inductor coupled output from a MOSFET power transistor to a tuned LC power transfer network. The need for the drive frequency to be a function of the resonant load suggests the use of a phase response mechanism and, accordingly, the oscillating means, the means for locking and the low pass filter means combination can be an integrated circuit oscillator circuit which is locked to the phase of the resonant load and drives the drive power means at or near the self-resonant frequency.

BRIEF DESCRIPTION OF THE DRAWINGS

For a better understanding of the invention, reference is made to the following description of an exemplary embodiment thereof, and to the accompanying drawings, wherein.

DETAILED DESCRIPTION

Figure 1:
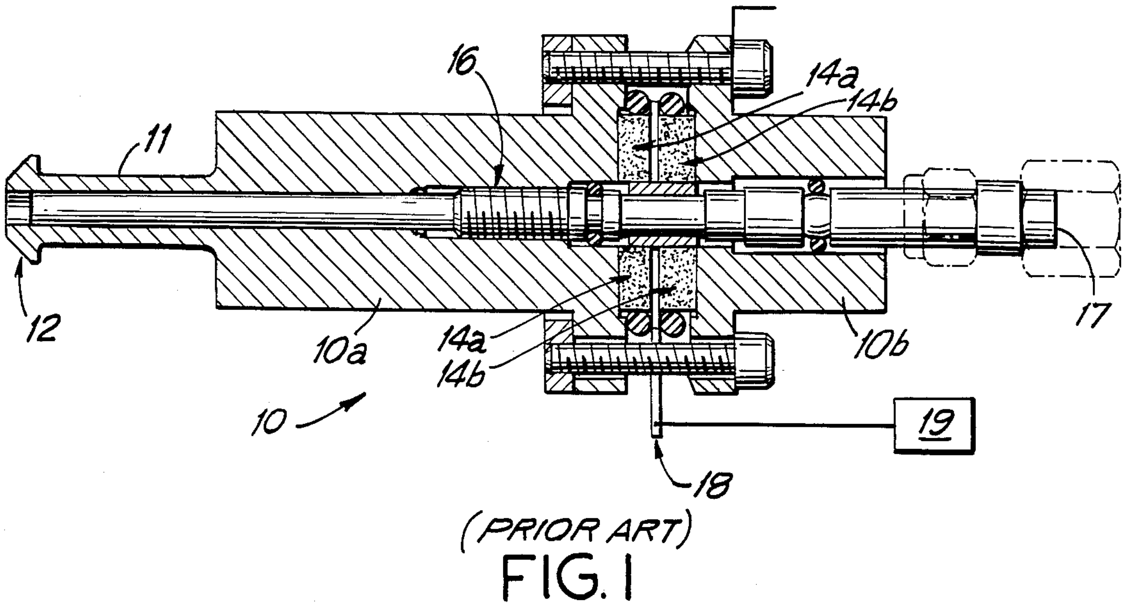
(PRIOR ART) FIG. 1
FIG. 1 is a cut-away elevational view of a typical ultrasonic atomizer.

FIG. 1 illustrates a typical ultrasonic atomizer 10. The atomizer 10 comprises a cylindrical metal front section 10*a*, having an elongated front portion 11 with a tip element 12, a cylindrical metal rear section 10*b*, and two piezoelectric (PZT) elements 14*a*, 14*b* sandwiched between the sections 10*a*, 10*b* so as to form the junction between the front section 10*a* and the rear section 10*b*. The metal sections 10*a*, 10*b* have axial dimensions chosen to be multiples of one-quarter wave acoustical lengths in the material from which they are constructed, for example, titanium. The front section 10*a* is nominally three-quarter wavelength and the rear section 10*b* is nominally one-quarter wavelength. A liquid feed tube 16 extends axially through the atomizer 10 from a liquid inlet 17, located at the rear section 10*b*, to the tip element 12 which acts as an atomizing surface. A contacting plane electrode 18 is situated in-between the two PZT elements 14*a*, 14*b* and extends beyond the structure of the atomizer 10. The electrode 18 are connected to a drive circuit 19 which supplies voltage and current to the PZT elements 14*a*, 14*b*.

In operation, a driving voltage and current are applied from the drive circuit 19 to the two PZT elements 14*a*, 14*b* via the electrode 18. The PZT elements 14*a*, 14*b* convert the electrical excitation into vibrational energy which is transmitted to the structure of the atomizer 10. When driven at the self-resonant, or series resonant, frequency, $f_S$, of the atomizer 10 structure (point of maximum admittance and zero phase), the PZT elements 14*a*, 14*b* produce a maximum motion at the tip element 12. If a suitable fluid is then introduced to the tip element 12, via the liquid feed tube 16, the fluid will atomize (i.e., break into small particles and dislodge from the tip element 12).

Figure 2:
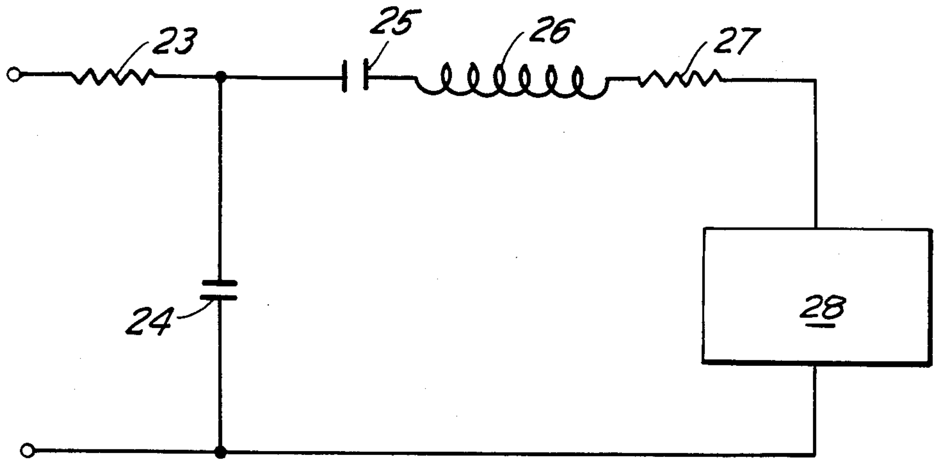
FIG. 2 is a schematic diagram of the equivalent electrical circuit of the ultrasonic atomizer of FIG. 1.

FIG. 2 illustrates an equivalent electrical circuit for the atomizer 10. The atomizer 10 can be represented by an input resistance 23 and a shunt capacitance 24 connected to an equivalent series capacitance 25 in series with an equivalent series inductance 26, an equivalent series resistance 27 and a load impedance 28 due to the dynamics of the atomizing fluid. The values of the input resistance 23 and the shunt capacitance 24 are obtained from measurements of the atomizer 10 operating at a frequency lower than the self-resonant frequency, $f_S$. The values of the equivalent series elements (the capacitance 25, the inductance 26, and the resistance 27) are determined by measurements of the atomizer 10 at the series resonant frequency, $f_S$ and the parallel resonant frequency, $f_p$ (i.e., point of maximum impedance and zero phase) when the atomizer 10 has no fluid contained therein. Note that the atomizing fluid load impedance 28 is equal to zero when no fluid is contained in the atomizer 10. The following formulas demonstrate the relationships between the above-mentioned elements of the equivalent circuit of FIG. 2:

$$C_S=(2\times C_O\times(f_P-f_S))/f_S;$$

$$L_S=1/((W_S^2)\times C_S);$$

$$R_S=Z_S-R_O;$$

where, $C_S$=the equivalent series capacitance 25;
$C_O$=the shunt capacitance 24;
$L_S$=the equivalent series inductance 26;
$W_S=2\times 3.141592\times f_S$;
$R_S$=the equivalent series resistance 27 at $f_S$;
$Z_S$=the measured impedance at $f_S$ and zero phase, and
$R_O$=the input resistance 23.

When an atomizing fluid is introduced to the atomizer 10, the load impedance 28 initially takes on a range of values due to the dynamics of fluid flow. The load impedance 28 takes on a maximum value when the tip element 12 is completely immersed in fluid. As can be seen from FIG. 2, the load impedance 28 contributes an additional impedance to the equivalent circuit of the atomizer 10. Furthermore, the structure of the atomizer 10 is altered by adding fluid to the tip element 12, such that, it can be shown experimentally that the self-resonant frequency, $f_S$is shifted to a lower frequency value. Consequently, the drive circuit 19 must supply additional drive power at a new frequency in order for the atomizing process to be maintained. In turn, the PZT elements 14*a*, 14*b* must transmit more vibrational energy (to overcome the additional resistance) at a new frequency (the new $f_S$) in order to maintain the operation of the atomizer 10. It is thus apparent that the dynamics of the fluid flow necessitate the drive circuit 19 to provide a range of drive power as well as to have adaptive frequency control.

Figure 3:
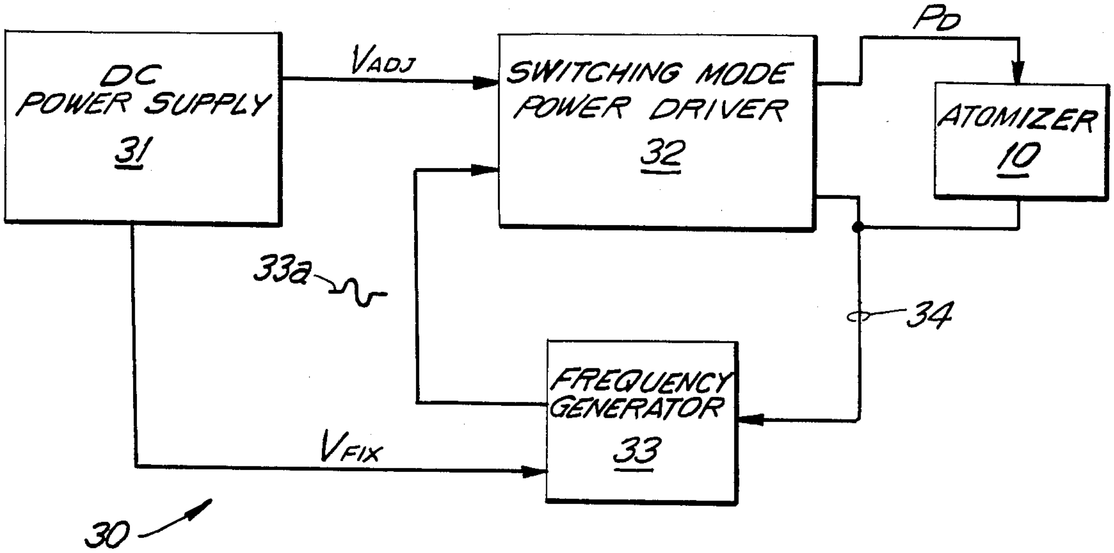
FIG. 3 is a block diagram of a drive circuit of the ultrasonic atomizer of FIG. 1.

A block diagram of a drive circuit 30 embodying the present invention is shown in FIG. 3. A DC power supply 31 supplies adjustable regulated DC voltage, $V_{ADJ}$, to a switching mode power driver 32 and a fixed regulated DC voltage, $V_{FIX}$, to a phase-locked frequency generator 33. The power driver 32 provides sinusoidal power, $P_D$ to the atomizer 10 (i.e., to the two PZT elements 14*a*, 14*b* via the electrode 18) at a frequency, $f_S$ determined by the frequency generator 33 and at a power level determined by the manually set DC power supply 31. The frequency generator 33, arranged as a positive feedback driver for the power driver 32, produces a drive signal 33*a* with a frequency proportional to the phase response of the atomizer 10 received from feedback loop 34.

Figure 4:
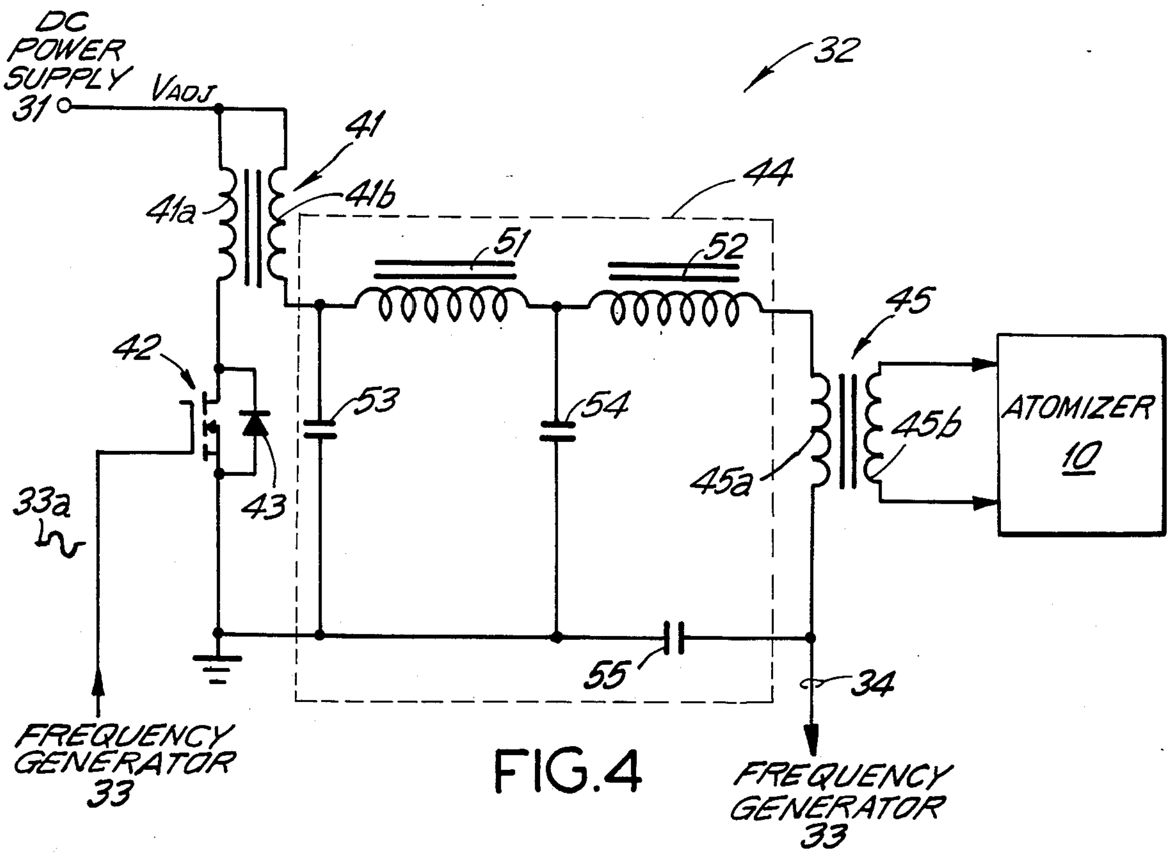
FIG. 4 is an electrical schematic diagram of the switching mode power driver shown in of FIG. 3.

A schematic diagram of the switching mode power driver 32 is shown in FIG. 4. A transformer/inductor 41 comprises a primary inductance 41*a* and a secondary inductance 41*b* and receives, from the DC power supply 31, the adjustable DC voltage, $V_{ADJ}$, which is the power set point control. The primary inductance 41*a* is driven by a single MOSFET power transistor 42 having a protection diode 43 (This section of the power driver 32 comprises the basic isolated switching stage). The MOSFET power transistor 42 receives the drive signal 33*a* from the frequency generator 33. The MOSFET power transistor 42 is chosen for two major reasons: (1) ease of producing a suitable drive signal 33*a* from the frequency generator 33 and (2) the absence of storage time which in a BIPOLAR transistor causes unpredictable frequency response by the power circuit. The secondary inductance 41*b* is coupled to the atomizer 10 through an LC network 44 and a transformer 45. The LC network 44 comprises first and second series inductors 51, 52 connected in series from the second inductance 41*b* to one end of a primary coil 45*a* of the transformer 45, first and second parallel capacitors 53, 54 connected before the first and second series inductors 51, 52, respectively, then to common, and a series capacitor 55 connected between the other end of the primary coil 45*a* and common. The other end of the coil 45*a* is also tied to the input feed (the feedback loop 34) of the frequency generator 33.

The primary inductance 41*a* is chosen consistent with the maximum power and nominal operating frequency requirements of the atomizer 10 and is determined as follows:

$$P_{IN}\times E_{FF}=P_{OUT}=P_D,$$

where, $E_{FF}$=the circuit efficiency, and
$P_D$=the power delivered to the atomizer 10.

In the isolated switching stage, energy is stored and released on successive half cycles. In order to deliver $P_D$, the energy storage required by the primary inductance 41*a* is $$U_D=(P_D/E_{FF})\times(1/(2\times f_S)).$$

It is known from basic electromagnetic theory that the energy storage of an inductor, such as, the primary inductance 41*a* is:

$$U_L=(\tfrac{1}{2})\times L_P\times(I_P^2),$$

where, $L_P$=the value of the primary inductance 41*a*, and $I_P$=the final value of current flow through the primary inductance 41*a*.

Assuming that the charge time constant of the primary concuit will determine the final value of current in a time period equal to $1/(2\times f)$ and $L_P/R_P$ is much greater than $1/(2\times f_S)$, where $R_P$ equals the total resistance in the primary inductance 41*a* and $V_{DC}$ equals the voltage supplied to the primary inductance 41*a*, then:

$$I_P=V_{DC}/(2\times L_P\times f_S).$$

Setting $U_L$ equal to $U_D$ from the above two equations and substituting the relationship for $I_p$, $L_p$ can then be solved for by the following equation:

$$L_P=(V_{DC}^2)/((P_D/E_{FF})\times 4\times f_S).$$

Figure 5A:
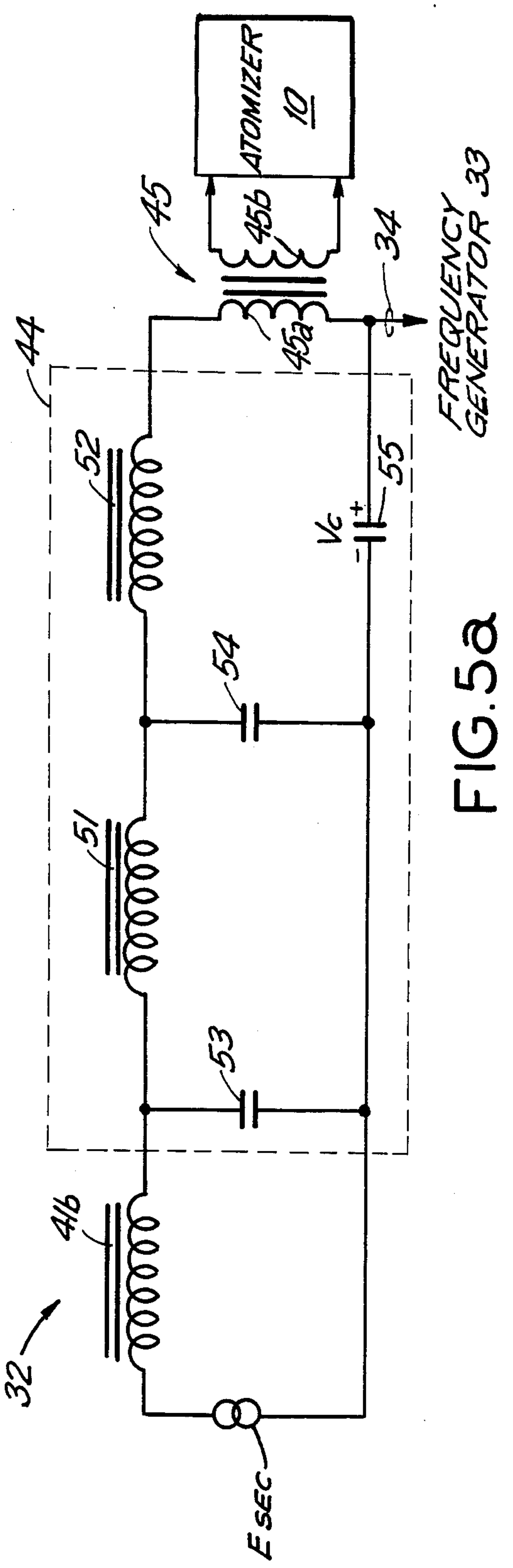
FIG. 5*a* is an electrical schematic diagram of the switching mode power driver of FIG. 4 shown as an LC power transfer network.
Figure 5B:
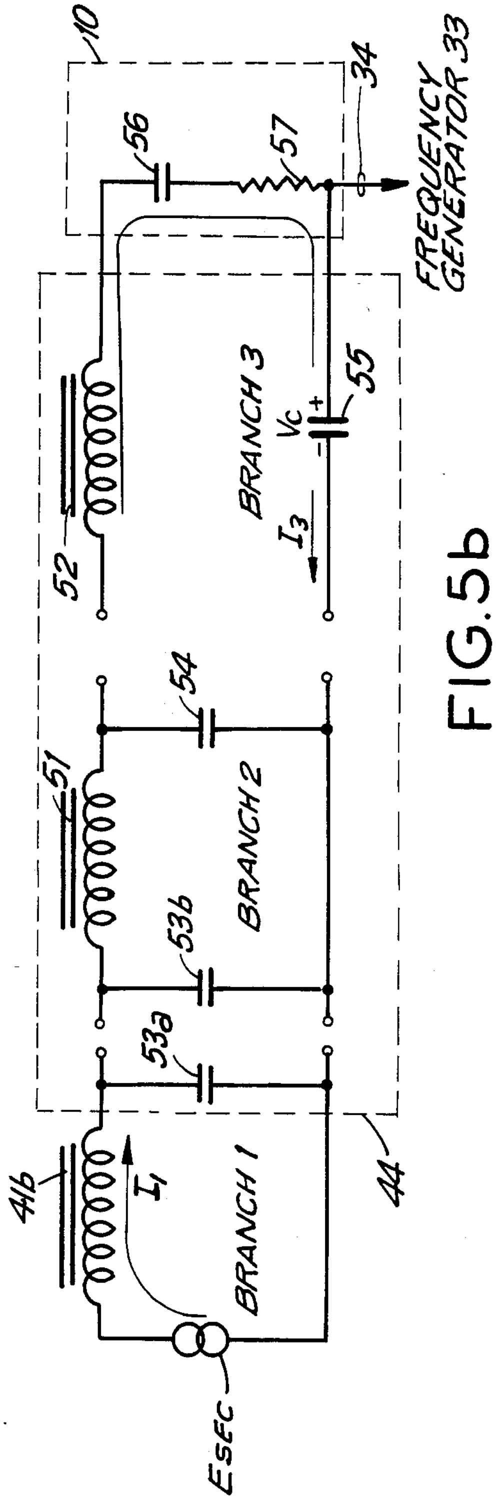
FIG. 5*b* is a trisected electrical schematic diagram of the switching mode power driver of FIG. 4 shown as a LC power transfer network.

The values of the remaining components of the power driver 32 are determined by the use of FIGS. 5*a* and 5*b* which show the power driver 32 as an LC power transfer network in a composite form and in a trisected form, respectively. Note that the first parallel capacitor 53 is shown in FIG. 5*b* as two parallel capacitors 53*a*, 53*b* in branches 1 and 2, respectively, in order to more properly describe the operation of the transfer network. The secondary inductance 41*b* together with the LC network 44 is tuned to the self-resonant frequency, $f_S$, of the atomizer 10 for maximum efficiency of power transfer and to filter harmonics generated by the switching mode operation. The atomizer 10 exhibits power absorbing resonance for odd harmonics; however, most of the energy is converted to heat in the PZT elements 14*a*, 14*b* instead of producing motion at the tip element 12 and therefore is undesirable.

The losses in the LC network 44 are due to the equivalent resistance of the inductors and capacitors. Capacitor losses are minimized by the selection of components with a high Q rating, (greater than 100), at the operating frequency of the atomizer 10. The minimization of inductor losses is more complex since those losses derive not only from the components themselves but are also a function of the operating conditions of the atomizer 10 (i.e., the current, frequency, temperature, etc.). Therefore, inductor losses can be minimized by designing the LC network 44 to operate at a minimum current as well as by the selection of appropriate inductor components.

In branch 3 of FIG. 5*b*, the initial values for the series capacitor 55, the second series inductor 52 and a turns ratio, $N_2$ for the transformer 45 are determined as follows. The series capacitor 55 and the second series inductor 52 are designed to be series resonant with the atomizer 10 in order to enable the atomizer phase response to control a branch current, $I_3$, through the series capacitor 55. The lossless reactance of the series capacitor 55 provides an output voltage, $V_C$, proportional to the phase of the current in the atomizer 10, to be developed across the series capacitor 55. It is this voltage which is used as the input for the frequency generator 33. In FIG. 5*b*, the atomizer 10 is represented by an equivalent series capacitor 56, which is the equivalent series value of the shunt capacitance 24, and an equivalent resistance 57 of the atomizer 10 at a frequency equal to $w_S$. The conversion of the shunt capacitance 24 of the atomizer 10 to the series element 56 is yielded by the following equation:

$$C_{ES}=1/((W_S^2)\times C_O\times(R_A^2)),$$

where, $C_{ES}$=the equivalent series capacitor 56 of the atomizer 10;

$C_O$=the shunt capacitance 24 of the atomizer 10;

$w_S=2\times 3.14159\times f_S$; and $R_A$=the equivalent resistance 57 of the atomizer 10 at the frequency equal to $w_S$.

The second series inductor 52 is selected to be resonant with the series combination of $C_{ESP}$, (i.e., $C_{ES}$ referred to the primary 45*a* of the transformer 45), and the series capacitor 55 according to the following equation:

$$L_3=(C_3\times C_{ESP})/(w_S^2\times(C_{ESP}+C_3))=2/(w_S^2\times C_{ESP}),$$

where, $L_3$=the value of the second series inductor 52, and $C_3$=the value of the series capacitor 55.

Note that the series capacitor 55 is initially chosen to be equal to $C_{ESP}$. The value for the second series inductor 52 is also chosen with regard to feedback considerations such that the current flowing through the second series inductor 52 is held to a minimum.

The turns ratio, $N_2$ of the transformer 45 is chosen to match the atomizer 10, at resonance, to the output impedance of the "PI" filter of branch 2. The turns ratio, $N_2$ has the following constraint:

$$N_2=N_{2S}/N_{2P}=I_3/I_1 \text{ minimum}$$

where $N_{2S}$=the turns of a secondary coil 45*b* of the transformer 45, $N_{2P}$=the turns of the primary coil 45*a* of the transformer 45, $I_1$=the current flowing in branch 1, and $I_3=I_A/N_2$ and $I_A=(P_D/Z_A)^{\frac{1}{2}}$, where, $I_A$=the current delivered to the atomizer 10, referred to the primary coil 45*a*, $Z_A$=the equivalent impedance of the atomizer 10 at a frequency equal to $w_S$.

In branch 1, the secondary inductance 41*b* furnishes the voltage and delivers the required current to the total load according to the following formula:

$$E_{SEC}=1.25\times R_3\times I_3 \text{ volts rms},$$

where, $E_{SEC}$=the voltage furnished by the secondary inductance 41*b*.

The term $R_3$ is the load of the atomizer 10 at resonance, reflected to the primary coil 45*a* (i.e., load seen by the network) and is equivalent to $Z_A/N_2^2+R_{L3}$, which for a desired efficiency of greater than 80%, follows the following formula: $R_3+R_{NET}=R_3/0.8$, where $R_{NET}$ is the load of the LC network 44. The turns ratio, $N_1$ of the transformer 41 can then be computed, assuming the operation of the switching power transistor 42 to be at 50% duty cycle, according to the following formula:

$$N_1=N_{1S}/N_{1P}=E_{SEC}/(0.176\times V_{DC}\times R_{NET})/(L_p\times f_S),$$

where, $N_{1S}$=the turns of the secondary inductance 41*b*, and $N_{2S}$=the turns of the primary inductance 41*a*.

It should be noted that the numerator in the above equation ($E_{SEC}$) also give the approximate rms voltage for the fundamental component of the half sine wave developed across the primary inductance 41*a*.

As seen in FIG. 5*b*, the low pass filter and impedance matching section of branch 2 is arranged in a three element "PI" configuration. Such a configuration can match the high impedance anti-resonant source, of branch 1, to any load impedance, of branch 3, and will filter the harmonics from the input waveform. By using frequency and impedance scaling factors, the values for the capacitor and inductor elements in branch 2 can be determined as follows. The frequency scaling factor, FSF is equal to $w_S$ and the impedance scaling factor, ZF, is equal to $R_3$. Normalized inductors, L' are scaled such that $L'=(L\times ZF)/FSF$ and normalized capacitors, C' are scaled such that $C'=C/(FSF\times ZF)$. Using a network with a Q of 10 normalized to 1 rad/sec operating frequency, the normalized values for the "PI" filter of branch 2 are as follows:

First parallel capacitor 53*b*=1.284 F;

Second parallel capacitor 54=0.5263 F; and

First series inductor 51=1.480 H.

Final values for the elements are then chosen to correspond to standard values for capacitors while the inductors are custom wound to specification.

The major characteristics of the afore-described LC power transfer network are:

(a) maximum efficiency of power transfer to the atomizer load;

(b) utilization of fixed parameter capacitors and inductors;

(c) broad bandwidth to allow for atomizer tuning variation with load and production tolerances of components; and (d) provision for a signal proportional to the phase of the current in the atomizer 10 suitable for input to the frequency generator 33.

Figure 6:
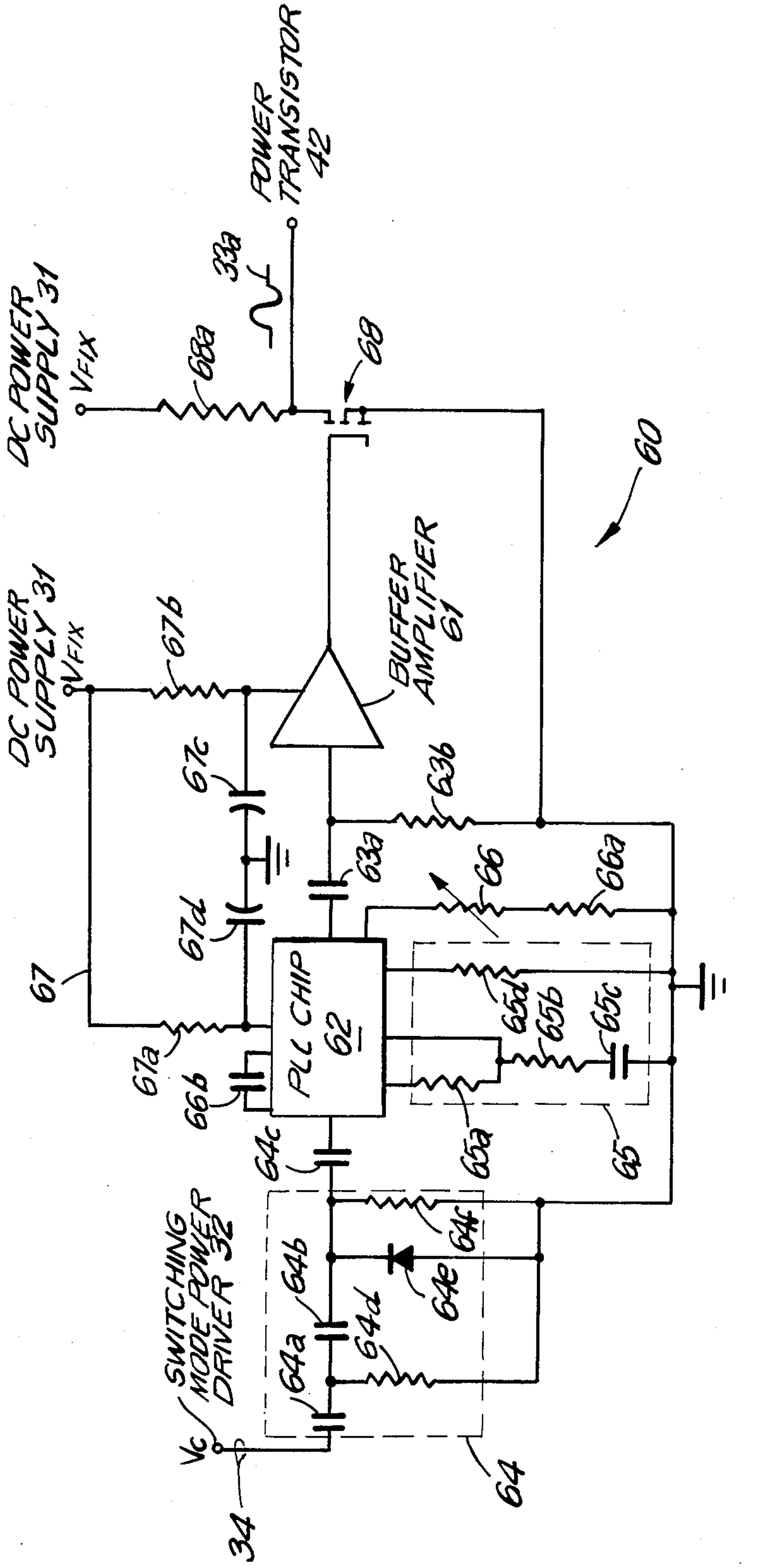
FIG. 6 is an electrical schematic diagram of the frequency generator shown in FIG. 3.

A schematic diagram of the frequency generator 33 is shown in FIG. 6. The frequency generator 33 comprises an oscillator circuit 60 having a voltage-controlled oscillator with the control voltage provided by a phase-detector network both contained within an integrated circuit phase-locked loop (PLL) chip 62, such as, a MC14046B. The PLL chip 62 is coupled to the input of a buffer amplifier 61 via a coupling capacitor 63*a* and resistor 63*b*.

Between the input feed 34 of the oscillator circuit 60, which is connected to the power driver 32 as previously mentioned, and the PLL chip 62 is a first RC network 64 which provides for a phase shift to compensate for the 90° shift between the output voltage, $V_C$ and the input signal to the atomizer. The phase shifter network 64 comprises two capacitors 64*a*, 64*b* in series coupling the series capacitor 55 of the power driver 32 to the PLL chip 62. Additionally, a first resistor 64*d* connects between the first two capacitors 64*a*, 64*b* and ground. A diode 64*e* and a second resistor 64*f*, parallel to the diode 64*e*, connect after the last capacitor 64*b* to ground, the diode's anode facing ground. Note that a coupling capacitor 64*c* connects the network with the PLL chip 62. The phase shifter network 64 is frequency sensitive and is varied to match the requirements for each type of atomizer 10. A second RC network 65 between pins 2 and 9 of the PLL chip 62 is a second-order low-pass filter providing coupling between the phase-detector network and the oscillator within the PLL chip 62. The second RC network 65 comprises a first resistor 65*a* connecting pin 2 of the PLL chip 62 with a second resistor 65*b* in series with a capacitor 65*c* connected to ground. Pin 4 of the PLL chip 62 is also connected to the second resistor 65*b*—capacitor 65*c* series arrangement. Pin 6 of the PLL chip 62 is connected to ground via a third resistor 64*d*. This second RC network 65 provides an effective inertia for the voltage-controlled oscillator and is determined experimentally for each atomizer model. Frequency tuning is provided by the adjustment of a variable resistor 66 in series with a constant resistor 66*a* between pin 11 (VCO stage) of the PLL chip 62 and ground. In concert with the variable resistor 66, a capacitor 66*b* between pins 6 and 7 of the chip 62 establishes the center of frequency from the oscillator.

The PLL chip 62 and the buffer amplifier 61 are powered from the DC power section 31 via a third RC network 67. First and second resistors 67*a*, 67*b* connect the power section 31 with power inputs of the PLL chip 62 and the buffer amplifier 61, respectively. First and second capacitors 67*c*, 67*d* couple the power inputs of the PLL chip 62 and the buffer amplifier 61, respectively, to ground. The output of the buffer amplifier 61 feeds into a MOSFET transistor 68, having an associated load resistor 68*a*, which, in turn, drives the output signal 33*a* to the isolated switching stage of the power driver 32. The combination of the buffer amplifier 61 and the MOSFET transistor 68 provide buffering and voltage amplification between the PLL chip 62 and the MOSFET power switching transistor 42 of the power driver 32.

Thus, in operation, when fluid is introduced to the atomizer 10 via the liquid feed tube 17, a dynamic load impedance 28 is introduced to the atomizer equivalent circuit. The effect of the new load impedance 28 is to cause a shift of the atomizer's self-resonant frequency, $f_S$ and equivalent impedance as well as the operating point of the transducer (i.e., the PZT elements 14*a*, 14*b*). The resistive component of the new load impedance 28 requires additional drive power, i.e., additional voltage, at the new frequency in order to maintain the appropriate current to the atomizer 10 and thus maintain operation.

As a result of the load change, the current through the atomizer 10 is reduced and phase-shifted. In turn, the output voltage, $V_C$, across the series capacitor 55, which is proportional to the phase of the current in the atomizer 10, is reduced and phase-shifted. When the voltage, $V_C$ is applied to the input feed 34 of the frequency generator 33, the PLL chip 62 locks in on the phase or frequency of the voltage. The phase-detector network in the chip 62 then feeds a DC signal, proportional to the phase of the output voltage, $V_C$, to the voltage controlled oscillator which shifts its oscillating frequency and outputs into the amplifier 61 and the MOSFET transistor 68. The MOSFET transistor 68 then sends the drive signal 33*a* to the isolated switching stage of the power driver 32 at or near the self-resonant frequency, $f_S$ of the atomizer 10. The inertia of the second-order low-pass filter 65 in the phase-locked loop within the oscillator circuit 60 controls the rate of the oscillator frequency shift. Consequently, the MOSFET power transistor 42 receives a drive signal from the frequency generator 33 with a frequency that now corresponds to the new self-resonant frequency, $f_S$ of the atomizer 10.

It is to be understood that the embodiments described herein are merely illustrative of the principles of the invention. Various modifications may be made thereto by persons skilled in the art without departing from the spirit and scope of the invention.

What is claimed is:

1. An ultrasonic transducer drive circuit comprising:
(a) variable power driving means for supplying power to and driving the transducer;
(b) oscillating means for generating and supplying a drive signal, with a frequency proportional to the phase response of the transducer during operation, to the power driving means, said drive signal fixing the frequency of the power supplied to the transducer substantially at the frequency of the transducer;
(c) phase detecting and locking means for detecting the phase response of the transducer during operation and inputting a signal proportional thereto to the oscillating means such that the frequency of the oscillating means is shifted proportional to the phase response of the transducer; and
(d) low pass filter means, coupled between the oscillating means and the phase detecting and locking means, for controlling the rate of the frequency shift of the oscillating means in response to said inputted signal from the phase detecting and locking means.

2. The drive circuit of claim 1 wherein the oscillating means, the phase detecting and locking means and the low pass filter means combination is a positive feedback driver for the driving means and the phase detecting and locking means detects, and is responsive to, a voltage outputted by the driving means and proportional to the phase of the current in the transducer.

3. The drive circuit of claim 2 wherein the oscillating means, the phase detecting and locking means and the low pass filter means combination composes an integrated circuit phase-locked loop oscillator circuit.

4. The drive circuit of claim 1 wherein the driving means comprises a transformer-coupled output of a MOSFET power transistor to a resonant power transfer network.

5. The drive circuit of claim 3 wherein the driving means comprises a transformer-coupled output of a MOSFET power transistor to a resonant power transfer network.

6. An ultrasonic generator comprising:
(a) transducing means for generating ultrasonic waves;
(b) variable power driving means for supplying power to and driving the transducer;
(c) oscillating means for generating and supplying a drive signal, with a frequency proportional to the phase response of the transducer during operation, to the power driving means, said drive signal fixing the frequency of the power supplied to the transducer substantially at the frequency of the transducer;
(d) phase detecting and locking means for detecting the phase response of the transducer during operation and inputting a signal proportional thereto to the oscillating means such that the frequency of the oscillating means is shifted proportional to the phase response of the transducer; and
(e) low pass filter means, coupled between the oscillating means and the phase detecting and locking means, for controlling the rate of the frequency shift of the oscillating means in response to said inputted signal for the phase detecting and locking means.

7. The ultrasonic generator of claim 6 wherein the oscillating means, the phase detecting and locking means and the low pass filter means combination is a positive feedback driver for the driving means and the phase detecting and locking means detects, and is responsive to, a voltage outputted by the driving means and proportional to the phase of the current in the transducer.

8. The ultrasonic generator of claim 7 wherein the oscillating means, the phase detecting and locking means and the low pass filter means combination composes an integrated circuit phase-locked loop oscillator circuit.

9. The ultrasonic generator of claim 6 wherein the driving means comprises a transformer-coupled output of a MOSFET power transistor to a resonant power transfer circuit.

10. the ultrasonic generator of claim 8 wherein the driving means comprises a transformer-coupled output of a MOSFET power transistor to a resonant power transfer network.

11. A method of adaptive frequency control for a drive circuit of an ultrasonic transducer, comprising the steps of:
(a) producing an electrical signal proportional to a phase response, corresponding to a frequency shift, of the transducer during operation and inputting said signal into a frequency generating means of the drive circuit;
(b) phase-shifting the electrical signal so as to compensate for any phase-shift arising from the producing step, and to match the electrical signal to the remainder of the frequency generating means;
(c) detecting a frequency shift of the transducer via a detection of said phase response, within a phase-locked loop of the frequency generating means, of the electrical signal;
(d) shifting the frequency of an oscillating means of the frequency generating means to correspond with the frequency shift previously detected;
(e) controlling the rate of the frequency shift of the oscillating means by using the inertia of a second order low-pass filter comprised in the phase-locked loop;
(f) generating and supplying a drive signal with a frequency proportional to the phase response of the transducer from the frequency generating means to power driving means of the drive circuit, said drive signal fixing the frequency of the power delivered to the transducer substantially at the frequency of the transducer.

* * * * *

UNITED STATES PATENT AND TRADEMARK OFFICE
CERTIFICATE OF CORRECTION

PATENT NO. : 4,642,581

DATED : February 10, 1987

INVENTOR(S) : John J. Erickson

It is certified that error appears in the above-identified patent and that said Letters Patent is hereby corrected as shown below:

Column 3, line 7, delete "are" and insert --is--.

Column 3, line 37, change "$f_p$" to --$f_P$--.

Column 3, line 45, change "$W_S2$" to --$w_S2$--.

Column 3, line 54, change "$W_S$" to --$w_S$--.

Column 4, line 1, change "$f_s$is" to --$f_S$,is--.

Column 5, line 25, change "$I_p$, $L_p$" to --$I_P$, $L_P$--.

Column 6, line 11, change "$W_S$" to --$w_S$--.

Column 7, line 7, change "$L_p$" to --$L_P$--.

Signed and Sealed this

Eighth Day of September, 1987

*Attest:*

DONALD J. QUIGG

*Attesting Officer* *Commissioner of Patents and Trademarks*